United States Patent [19]

Stewart

[11] 4,329,600
[45] May 11, 1982

[54] OVERLOAD PROTECTION CIRCUIT FOR OUTPUT DRIVER

[75] Inventor: Roger G. Stewart, Neshanic Station, N.J.

[73] Assignee: RCA Corporation, New York, N.Y.

[21] Appl. No.: 84,711

[22] Filed: Oct. 15, 1979

[51] Int. Cl.³ .............................................. H03K 5/00
[52] U.S. Cl. .................................... 307/540; 307/549; 307/571; 307/270
[58] Field of Search ............... 307/251, 200, 215, 270, 307/255, 546, 547, 8, 9; 330/298, 264; 361/5, 6, 88, 92, 101, 91

[56] References Cited

U.S. PATENT DOCUMENTS

| | | | |
|---|---|---|---|
| 3,493,878 | 2/1970 | Fautale | 330/298 |
| 3,641,361 | 2/1972 | Limberg | 307/237 |
| 3,641,368 | 2/1972 | Gamble et al. | 307/215 |
| 3,979,607 | 9/1976 | Beelitz | 307/214 |
| 4,037,114 | 7/1977 | Stewart et al. | 307/215 |
| 4,061,983 | 12/1977 | Suzuki | 330/298 |
| 4,194,134 | 3/1980 | Bjorklund et al. | 307/255 |
| 4,232,273 | 11/1980 | Leidich | 330/298 |

Primary Examiner—Stanley D. Miller, Jr.
Assistant Examiner—B. P. Davis
Attorney, Agent, or Firm—Samuel Cohen; Henry I. Schanzer

[57] ABSTRACT

A protection circuit for preventing excessive power dissipation in an output transistor whose conduction path is connected between a power terminal and an output terminal. The protection circuit includes means for sensing the application of a turn on signal to the output transistor and the voltage at the output terminal. When the turn on signal is maintained for a period of time greater than a given period without the voltage at the output terminal reaching a predetermined value, the protection circuit decreases the turn on signal to, and the current conduction through, the output transistor.

14 Claims, 7 Drawing Figures

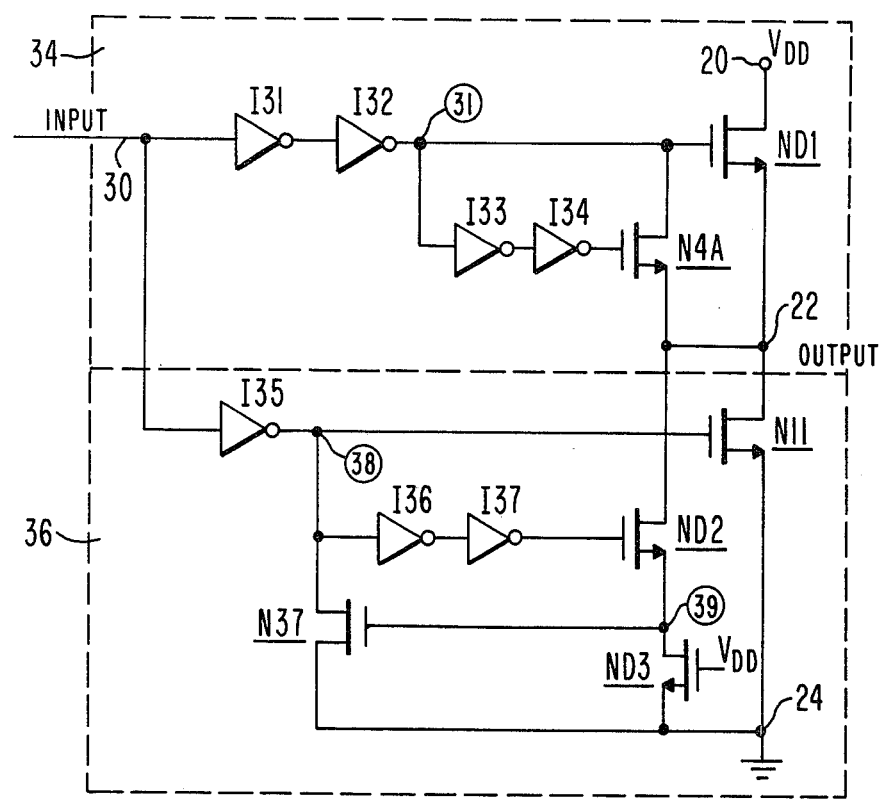
Fig. 3.
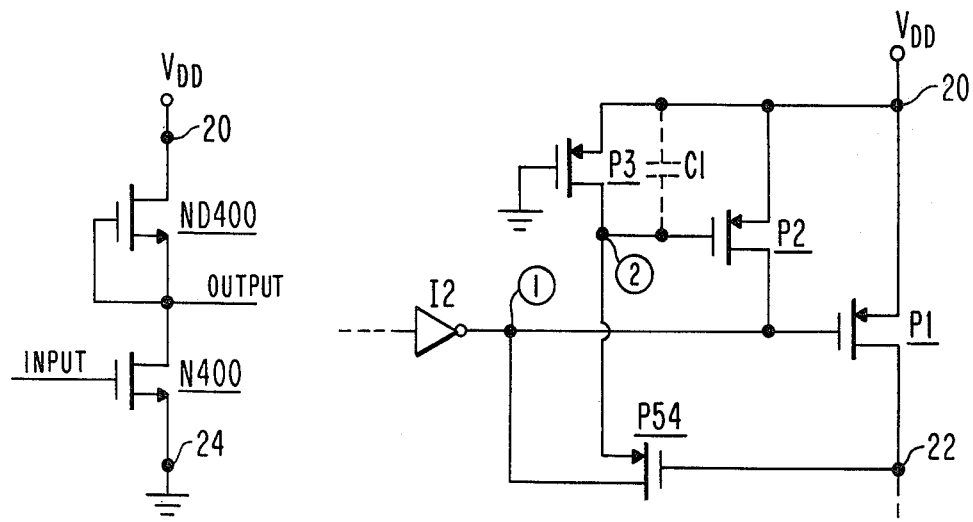
Fig. 4.
Fig. 5.

OVERLOAD PROTECTION CIRCUIT FOR OUTPUT DRIVER

The Government of the United States of America has rights in this invention pursuant to contract number 456,510-AGS awarded by Brookhaven National Laboratory.

This invention relates to electrical circuits and, in particular, to circuits which include means for limiting excessive power dissipation in their output stage.

In order to quickly charge and discharge capacitive loads (which may be in the order of thousands of picofarads) it is necessary for the output stage of a circuit to have active pull-up and pull-down circuitry. Thus, the output stage may include a first drive transistor to clamp the circuit output to a first point of operating potential and a second drive transistor to clamp the output to a second point of potential. To ensure fast and tight clamping action, the transistors should be capable of carrying large currents and there should be very little, if any, resistance in series with the conduction paths of the first and second transistors to limit the current. However, a problem exists if the circuit output is short circuited or a low impedance load is connected to the output for a period of time which exceeds the thermal time constant ($T_{TH}$) (typically in the order of milliseconds) of the circuit. The combination of high voltage across and high current through an output transistor causes excessive power dissipation in the transistor and if this continues for a period of time which exceeds the thermal time constant ($T_{TH}$) of the drive transistor it overheats. This may damage or destroy the transistor and associated circuitry. Also, excessive power demands are placed on the power supply.

Accordingly, circuits embodying the invention include a protection circuit for an output driver transistor whose conduction path is connected between a power terminal and an output terminal and which, when turned on, drives the voltage at the output terminal towards that at the power terminal. The protection circuit includes means for sensing when a turn on signal is applied to the driver transistor and the level of the voltage at the output terminal. If the voltage at the output terminal does not reach a predetermined value within a given period of time after the application of a turn on signal, the protection circuit decreases the turn on signal applied to the control electrode of the transistor and the current conduction through it.

In the accompanying drawings like reference characters denote like components, and FIG. 1, is a partial block, partial schematic, diagram of a tri-state driver embodying the invention, FIGS. 2A, 2B and 2C are detailed schematic diagrams of a complementary inverter, a NOR gate, and a NAND gate, respectively, suitable for use in the circuit of FIG. 1;

FIG. 3 is a schematic diagram of a driver circuit embodying the invention;

FIG. 4 is a detailed schematic diagram of an inverter suitable for use in the circuit of FIG. 3; and FIG. 5 is a detailed schematic diagram of a portion of a pull-up circuit embodying the invention.

Figure 1:
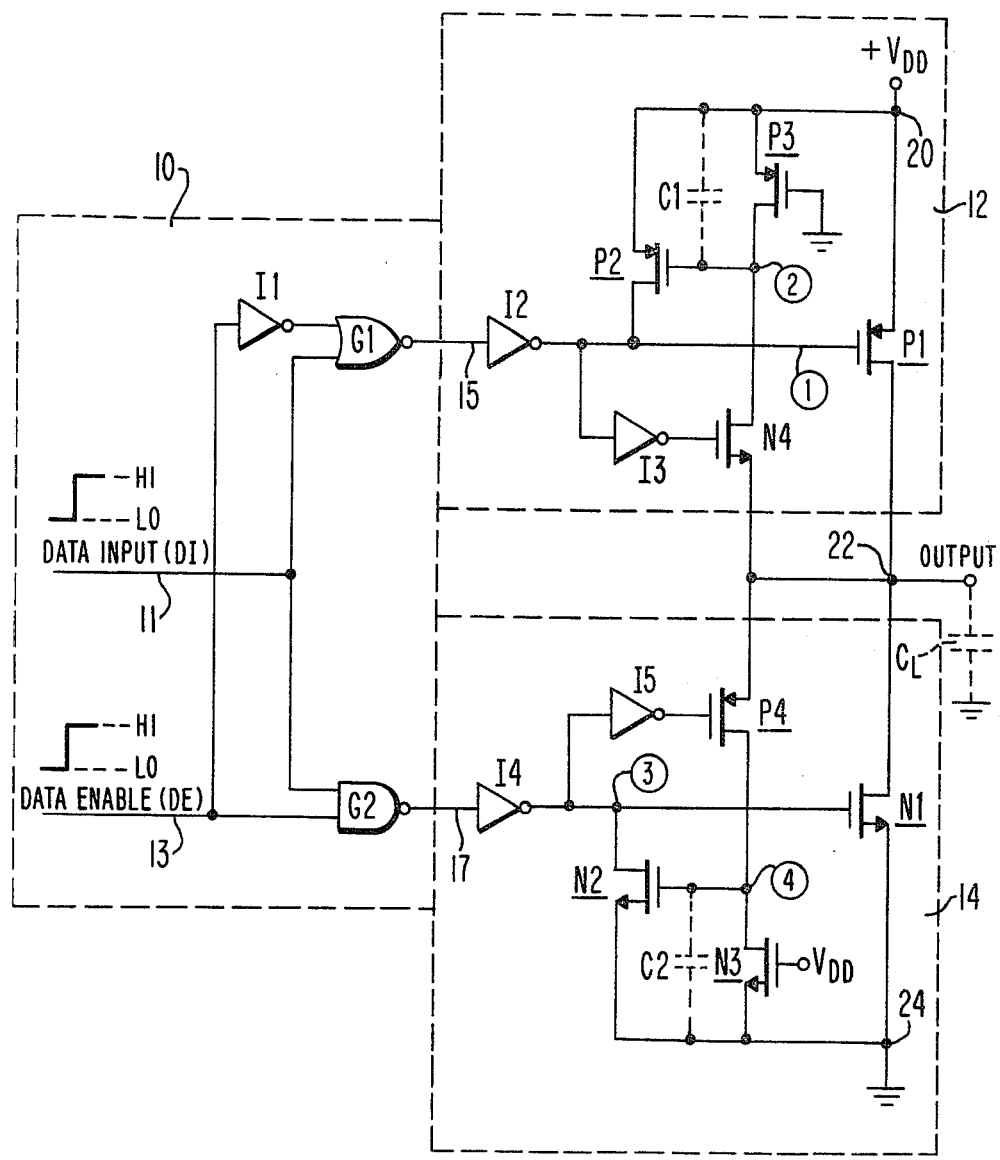

The circuit of FIG. 1 includes an input control section 10, a pull-up section 12 and a pull-down section 14.

Figure 2A:
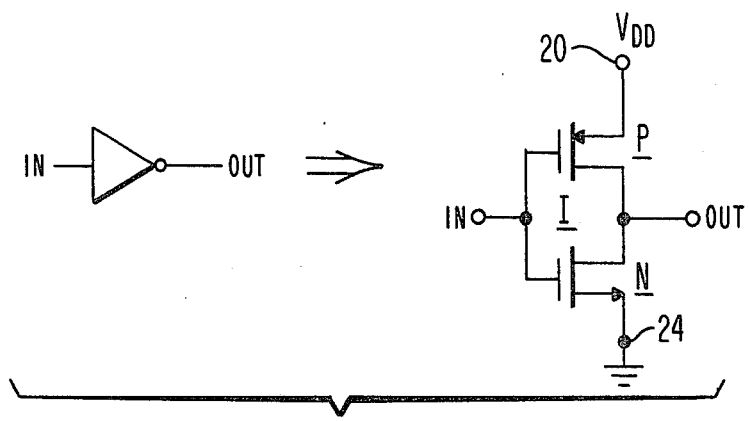
Figure 2B:
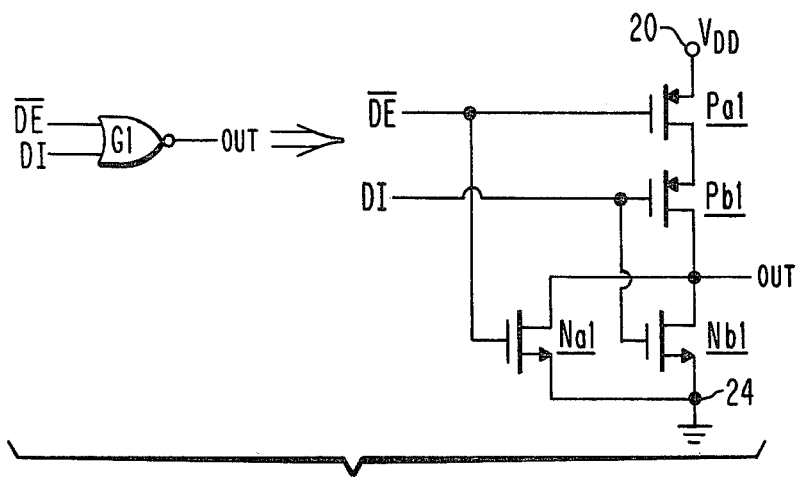
Figure 2C:
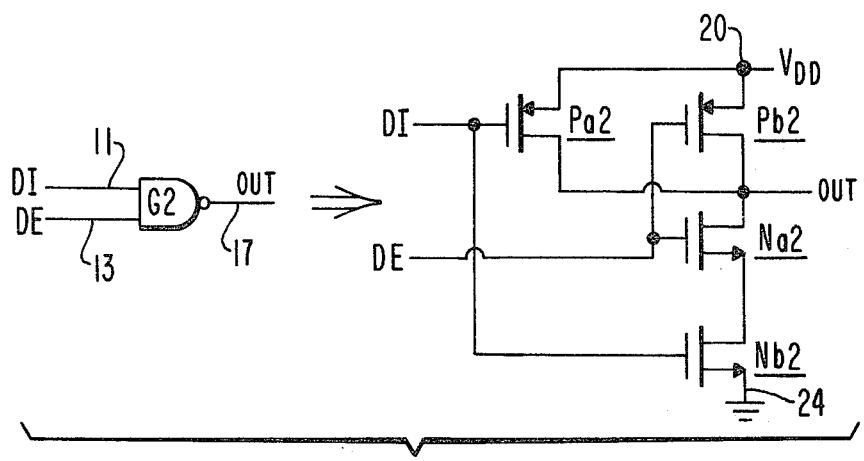

The input control section 10 has two signal input lines 11 and 13 and two signal output lines 15 and 17. Input line 11 is a data input (DI) line and line 13 is a data enable (DE) line. Input control section 10 includes an inverter I1, a two input NOR gate G1, and a two input NAND gate G2. Inverter I1 as well as the other inverters of FIG. 1, and gates G1 and G2 may be formed with transistors of complementary conductivity type as shown in FIGS. 2A, 2B, and 2C, respectively. But, it should be evident that any other suitable device providing the same logic functions could be used instead. The DE signal is applied to the input of inverter I1 and one input of gate G2. The output of inverter I1 is applied to one input of gate G1. The DI signal is applied to the other input of gates G1 and G2. The output of gate G1 is applied to line 15 which is connected to the input of an inverter I2 in pull-up section 12 and the output of gate G2 is applied to line 17 which is connected to the input of an inverter I4 in pull-down section 14.

The signals on the input and output lines of control circuit 10 can assume either one of two binary values. When the DE signal is "low" the voltage ($V_{15}$) on line 15 is low and the voltage ($V_{17}$) on line 17 is high, regardless of the value of the DI signal, as set forth in TABLE 1 below. For this input signal condition, the output 22 of the driver circuit "floats", being neither clamped to $V_{DD}$ nor to ground. When the DE signal is "high" the output 22 is the logical inverse of DI. If the DI signal is high (with DE-High) $V_{15}$ and $V_{17}$ are low, and the output 22 is to be clamped to ground potential. For DI low (with DE-High) $V_{15}$ and $V_{17}$ are high, and the output 22 is to be clamped to $V_{DD}$ volts.

TABLE 1

| DE | DI | $V_{15}$ | Node 1 | P1 | $V_{17}$ | Node 3 | N1 | $V_{22}$ |
|---|---|---|---|---|---|---|---|---|
| LO | HI | LO | HI | OFF | HI | LO | OFF | FLOATING |
| LO | LO | LO | HI | OFF | HI | LO | OFF | FLOATING |
| HI | LO | HI | LO | ON | HI | LO | OFF | $V_{DD}$ |
| HI | HI | LO | HI | OFF | LO | HI | ON | $G_{ND}$ |

The pull-up section 12 includes an inverter I2 connected at its output to a node 1 to which is connected the gate of an output pull-up driver transistor P1. The source-to-drain path of P1 is connected between power terminal 20 and output terminal 22. $V_{DD}$ volts applied to terminal 20 is positive with respect to ground potential Overload protection circuitry for P1 includes an inverter I3 and transistors P2, P3 and N4. Inverter I3 is connected at its input to node 1 and at its output to the gate of source follower transistor N4. The source electrode of N4 is connected to output terminal 22 and its drain electrode is connected to a node 2 to which is also connected the gate of transistor P2 and the drain of transistor P3. The sources of P2 and P3 are connected to terminal 20 and the gate of P3 is returned to ground potential whereby P3 functions essentially as a resistive element. The capacitance present between node 2 and terminal 20 is represented by C1, shown in phantom view. This capacitance includes the gate-to-source capacitance of P2 and the drain-to-source capacitance of P3 and may be assumed to be a few picofarads. C1 in combination with P3 functions as a delay network as explained below.

The pull down section 14 includes inverter I4 connected at its input to line 17 and at its output to a node 3 to which is connected the gate electrode of a pull-down transistor N1. The source-to-drain path of N1 is connected between terminal 22 and power terminal 23 to which is applied ground potential. Overload protection circuitry for N1 includes an inverter I5 and transistors N2, N3, and P4. Inverter I5 is connected at its input to node 3 and at its output to the gate of source follower transistor P4. The source of P4 is connected to terminal 22 and its drain is connected to a node 4 to which is connected the gate of N2 and the drain of N3. The sources of N2 and N3 are connected to terminal 24 and the gate of N3 is returned to $V_{DD}$, whereby N3 functions as a resistive element. The capacitance present between node 3 and ground is represented by C2, shown in phantom view, which together with N3 forms a delay circuit. In the discussion below, it is assumed that inverters I2, I3, I4 and I5 are of the type shown in FIG. 2A. That is, each inverter includes a P-type IGFET and a N-type IGFET having their conduction paths connected in series between $V_{DD}$ volts and ground potential. The gates of the P and N type transistors are connected to the inverter input and their drains are connected to the inverter output.

The operation of the circuit will be explained by first examining normal operation and then the role of the protection circuitry during an overload condition.

When DE is low $V_{15}$ is "low" and $V_{17}$ is "high" regardless of the value of DI. For this condition, the output of I2 is high which turns-off P1 and causes the output of I3 to go low which turns off N4. Concurrently, since $V_{17}$ is high, the output of I4 is low which turns off N1 and causes the output of I5 to go high which turns off P4. Since P1, P2 and N4 and N1, N2 and P4 are off there is no conduction (except for leakage) between terminals 20 and 22 and between 22 and 24 and the output 22 "floats".

When DE is high and DI is low, $V_{15}$ and $V_{17}$ are high. With $V_{17}$ high, node 3 is low, pull down transistor N1 remains turned-off and the pull down section does not affect circuit operation. With $V_{15}$ high the output of I2 goes low turning on P1, and the output of I3 goes high. The high output of I3 then turns on N4. Transistor P1 is a large device (much larger than N4) capable of carrying much greater current than transistor N4.

Assuming the capacitance ($C_L$) present at the output 22 to be within its rated range, transistor P1, which is turned on hard, conducts heavily and the voltage ($V_O$) at output 22 quickly rises towards $V_{DD}$ volts, with P1 eventually clamping terminal 22 to terminal 20.

After P1 is turned-on N4 is also turned on since $V_{DD}$ volts is applied to its gate and since its source is connected to output 22 which is assumed to be at ground when P1 is first turned on. When N4 is first turned on, it draws current from its drain circuit and supplies that current into the output 22 which helps raise $V_O$. However, the voltage $V_2$ at node 2 does not drop immediately due to the presence of C1. The voltage across the capacitor can not change instantaneously and node 2 is initially held at $V_{DD}$ volts. Rather, $V_2$ decays from the $V_{DD}$ level with a time constant ($T_D$) which is a function of C1 and the relative impedances of P3 and N4. In this circuit $V_2$ is designed to decay slowly.

Under normal operating conditions, the output 22 is driven to a value close to $V_{DD}$ volts which turns off N4 in a period of time which is less than the time it takes N4 to discharge node 2 by an amount $V_T$, where $V_T$ is equal to the threshold voltage of P2. Thus, under normal operating conditions, the time ($T_N$) for P1 to charge the rated load capacitance $C_L$ to a level which turns off N4 is less than the time ($T_D$) it takes N4 to discharge node 2 from $V_{DD}$ volts to [$V_{DD}-V_T$] volts.

Although N4 may be turned on as soon as or very shortly after, P1 is turned on, the response at its drain is delayed as described. Furthermore, N4 conducts in the source follower mode, and when P1 conducts, the source of N4 is driven in a positive direction reducing its gate-to-source potential ($V_{GS}$) and it quickly turns off. With N4 turned off, node 2, if its voltage has decayed below $V_{DD}$, is quickly brought up to $V_{DD}$ volts and remains at, or close to, $V_{DD}$ volts and transistor P2 remains turned off.

Overload of P1 occurs if P1 cannot pull up the potential at terminal 22 to, or close to, $V_{DD}$ volts. An overload condition may be due to the presence of a short circuit to ground at the output or due to the connection thereto of an extremely low impedance load (e.g. greater than 200,000 picofarads). The overload condition causes excessive heating of P1 since P1 is then supplying a large current with substantially the full $V_{DD}$ volts across its conduction path. For ease of the discussion below assume that the output is short circuited to ground and that P1 is turned on.

Recall that after P1 is turned on (by the output of I2 going low), the output of I3 connected to the gate of N4 goes to $+V_{DD}$ and N4 is turned on. Transistor N4 thus senses two conditions: (a) inferentially it senses the application of a turn-on voltage to the gate of P1; since I3 applies the inverse of $V_1$ to the gate of N4; and (b) the voltage produced at output 22 in response to the turn-on command since the source of N4 is connected to output 22. The gate to source ($V_{GS}$) of transistor N4 is used to sense the differential between the output of I3 and the output voltage $V_{22}$.

N4 when first turned on conducts and passes current from node 2 into output 22 which helps raise the output voltage towards $V_{DD}$. Although the turn on of N4 follows fairly quickly after the turn on of P1 the effect of its conduction is delayed at node 2 by the action of C1 and P3 which prevent $V_2$ from dropping immediately. $V_2$ decays from $V_{DD}$ volts to $V_{DD}-V_T$ volts in a time period of $T_D$.

The protection circuit functions to reduce the power dissipation in P1 if N4 is turned on for a time greater than $T_D$. Assume that P1 is on and that the output 22 is shorted to ground for a time greater than $T_D$. A time $T_D$ after the application of the short, node 2 is discharged to the point that $V_2$ is ($V_{DD}-V_T$) volts and transistor P2 turns on. When P2 turns on its raises the output of inverter I2 towards $V_{DD}$. P2 is usually a lower impedance device than the P or the N transistor of I2. Consequently, when P2 turns on, it causes $V_1$ to rise towards $V_{DD}$ volts. This raises the potential applied to the gate of P1 and hence decreases its conductivity. The current through P1 may be substantially decreased going from an initial value of, for example, 200 milliamperes to a value of a few milliamperes.

Although the level of conduction through the output transistor P1 is decreased substantially, P1 is not turned off completely. This ensures the quick recovery of P1 to full conduction when the short or fault condition is removed. As noted, when P2 is turned on, conduction through P1 is decreased by raising $V_1$. However, raising $V_1$ causes a rise in the input voltage to inverter I3 causing a decrease in the conductivity of the P-transistor (PI3) of inverter I3 and an increase in the conductivity of its N-type transistor (NI3). This in turn decreases the turn on of N4 which decreases the current through N4 causing $V_2$ to rise in potential and P2 to conduct less. The extent to which conduction through P1 is decreased is thus limited by negative feedback via the loop which includes inverter I3, and transistors N4, P3 and P2.

Inverter I3 may be viewed as a first inverting stage, transistors N4 and P3 as a second inverting stage, and transistor P2 as a third inverting stage. The output of I3 is applied to the input (gate of N4) of the second inverter; the output of the second stage (drains of N4 and P3) is applied to the input (gate of P2) of the third stage; and the output of the third stage is fed back to the input of the first stage I3.

These three inverting stages from a high gain loop which decreases the conduction of P1 after a time $T_D$ but which also functions to ensure that there is some conduction through P1 so long as short or fault condition exists at the output 22.

The three inverter loop may be dc stable whereby a constant dc current flows through P1 during the overload condition. However, due to the high gain of the loop it is possible for the loop to oscillate. But, this does not present a problem since the effect is still cut down the excessive steady state dissipation through P1 while allowing its quick recovery.

Maintaining P1 conducting, although at a low level, is desirable to ensure quick recovery and quick charge up of the output when the short circuit or fault is removed from the output.

In addition, the source follower action of transistor N4 ensures that N4 will turn off once the short circuit or fault condition is removed. In the absence of the three inverter loop and assuming the current through N4 to be greater than the leakage current at the output, N4, with the short removed will cause $V_O$ at output 22 to charge up towards $V_{DD}$. As the output 22 rises towards $V_{DD}$ decreasing the conduction of P2. This brings in the positive or regenerative feedback loop including P2, I3, N4 and P1. The decrease in the conduction of P2 enables $V_1$ to return towards ground potential further increasing conduction through P1, which further rises $V_O$ towards $V_{DD}$ and further decreases the conduction through N4. The process repeats regeneratively until N4 is fully turned off and P1 clamps the output terminal to $V_{DD}$.

The operation of the pull down circuit 14 is similar to that of the pull up circuit 12 except that the pull down circuit 14 is the complement of circuit 12 and functions to clamp output 22 to ground. With regard to the operation of circuit 14 a problem occurs when the output terminal is short circulated to $V_{DD}$ or an excessively low impedance load (e.g. a capacitance $C_L > 200,000$ picofarads charged to $V_{DD}$) is connected between the output 22 and $V_{DD}$.

Transistors N2, N3 and P4 of pull down circuit 14 correspond functionally to transistors P2, P3 and N4 of pull up circuit 12, respectively, and inverters I4 and I5 correspond functionally to inverters I2 and I3.

A "low" on line 17 causes the output of I4, which drives node 3, to go high ($V_{DD}$ volts) turning on N1. Under normal conditions N1 discharges the output from $V_{DD}$ to ground in a time $T_{N1}$. Transistor P4, turned on at the same time as N1, conducts current in the source follower mode from the output 22 into node 4. Node 4 initially at ground must be charged to $V_T$ volts before N2 is turned on. C2 in combination with N3 function as a delay network such that it takes a time $T_{D1}$ the voltage ($V_4$) at node 4 to reach $V_T$ volts. The time $T_{N1}$ is less than the time $T_{D1}$. Thus, if the output is discharged to ground prior to $T_{D1}$, P4 turns off and $V_4$ is discharged to zero volts via N3. If the short or fault condition persists for a time greater than $T_{D1}$, N2 is turned on decreasing the voltage ($V_3$) at node 3 and the conductivity of N1 is substantially decreased. As for the pull up circuit, when N2 turns on it decreases the input to I5 which in turn increases the gate voltage of P4 decreasing its conductivity and the current fed back to N2, such that N1 is not fully turned off.

The operation of section 14 is the mirror or complement of the operation of circuit 12, described above, and need not be further detailed.

In the circuit of FIG. 1 the gate electrode of N4 could be returned to line 15 and inverter I3 could be eliminated. In a like manner the gate of P4 could be returned to line 17 and I5 eliminated. For these connections the benefit of the negative feedback loop is not obtained and the output transistors (N1, P1) would be driven much closer to cut-off in response to a short circuit. However, the source follower action of N4 and P4 ensure that upon the removal of the short or fault condition at the output 22 that the output transistors could recover and become fully turned on.

The circuit of FIG. 3 illustrates an overload protection circuit for a logic driver using transistors of the same conductivity type as the output transistor. The logic driver includes a pull up section 34 which is energized when the data input (DI) on line 30 is "high" and a pull down section which is energized when the data input on line 30 is "low". The pull up section includes cascaded inverters I31 and I32 connected between line 30 and node 31 to which is connected the gate electrode of an N-type depletion transistor ND1 whose conduction path is connected between terminals 20 and 22. Depletion type transistors are identified herein by the letter "D" following the letter (N or P) indicating its conductivity type. The inverters in FIG. 3 may be of single conductivity type as shown in FIG. 4. Each inverter includes a depletion load device ND400 whose conduction path is connected in series with the conduction path of a like conductivity type enhancement type transistor N400 between $V_{DD}$ and ground. The input to the inverter is applied to the gate electrode of the enhancement transistor N400 and the output of the inverter is derived from a point common to the gate and source of the depletion transistor ND400 and the drain of ND400.

When the data input is high, the pull up section is energized. A high is produced at the output of I32 and applied to the gate ND1 which is then turned on hard and clamps the output 22 to power terminal 20. When the data input is low the gate of ND1 is grounded and although still conducting its conduction is considerably decreased.

Inverters I33 and I34 couple the data of I32 to the gate of transistor N4A whose source-drain path is connected between the gate and source of transistor ND1.

Inverters I33 and I34 (especially I34) are skewed (i.e. they respond more slowly to signals having a polarity and magnitude to turn them on than to signals having a polarity and magnitude to turn them off) to delay the propagation of the turn on signal produced at the output of I32 whereby a turn on signal applied to the gate of ND1 appears at the gate of N4A a time $T_{D2}$ later. Thus, for loads in the rated range, ND1 will charge the output terminal to a predetermined value prior to N4A turning on or to a value which will prevent significant conduction through N4A.

In the event that the output 22 is not brought up to the required value during a time $T_{D2}$ (e.g. due to a short circuit or fault condition), N4A turns on since its source is at zero volts while its gate is at, or close to, $V_{DD}$ volts.

Transistor N4A, when turned on, decreases substantially the conduction through ND1. However, since ND1 is a depletion type transistor it will continue conducting even when its gate-to-source potential is at zero volts.

The extent to which ND1 is turned off is also controlled by means of a high gain negative feedback loop comprising I33, I34 and N4A. When N4A turns on it decreases the high input to I33 which increases the turn on to I34, which in turn decreases the amount of turn on to N4A. Thus, as for the circuit of FIG. 1, negative feedback is employed to control the extent of the decrease in conductivity of the output transistor.

The pull down section 36 of FIG. 3 includes an inverter I35 connected at its input to line 30 and at its output to node 38 to which is connected the gate of a transistor N11 whose source drain path is connected between output 22 and ground terminal 24.

The overload protection circuitry for N11 includes inverters I36 and I37 connected between node 38 and the gate of a depletion type transistor ND2 connected at its drain to output 22 and at its source to a node 39. The conduction which of a depletion transistor ND3 whose gate is returned to $V_{DD}$ is connected between node 39 and terminal 24. A transistor N37 is connected at its gate to node 39 and its source drain path is connected between node 38 and ground.

When DI is "low" the voltage ($V_{38}$) at node 38 goes high and N11 is turned on hard discharging output 22 to ground. The high at $V_{38}$ is applied via I36 and I37 to the gate of ND2. I36 and I37 may be skewed to delay the application of the high signal to the gate of ND2. ND2 is a depletion type device and conducts even with zero volts between its gate and source. Until a high signal is applied to its gate ND2 is not conducting hard and ND3 with $V_{DD}$ connected to its gate hold node 39 at, or close to, zero volts.

Normally N11 discharges output 22 to ground within a time $T_{N2}$ which is less than the time $T_{D3}$ it takes for the high signal to be propagated to the gate of ND2. With the output grounded, ND2, even with a high at its gate, will not affect the output 22 or the value of potential at node 39 which is discharged to, or close to, ground via ND3. With node 39, at or close to ground, transistor N37 is turned off and the overload protection circuit does not affect circuit operation.

If N11 cannot discharge (or has not discharged) output 22 within a time $T_{D3}$ after it is turned on, ND2 is then turned on hard and raises the potential at node 39. This causes the turn on of N37 which pulls down node 38 decreasing the conduction of N11. However, when $V_{38}$ decreases the turn on to ND2 also decreases which in turn decreases the drive to N37. Thus, conduction through N11 is decreased but N11 is not completely turned off due to a high gain negative feedback loop.

In summary, circuits embodying the invention do not degrade normal operation of the circuit.

The circuit of the invention allows large currents to flow for a period of time which is less than the thermal time constant of the transistors or of the substrates on which, or in which, the transistors are formed. The overload protection circuitry is only activated in the event that an overload condition exists and persists for a period which exceeds certain design criteria.

The output driver need not be shutoff completely, it is only powered down to a safe region, thereby enabling fast recovery.

Finally, controlled shut down is achieved by using a negative feedback arrangement which is fast and which provides a high degree of control.

The circuit of FIG. 5 shows a portion of a pull-up section with an overload protection circuit in which a single negative feedback stage is employed and in which the transistors are of the same conductivity type.

Transistors P1, P2 and P3 correspond to the like numbered transistors in section 12 of FIG. 1. A transistor P54 is connected at its gate to output 22 at its source to node 2 and at its drain to node 1. Transistor P54 performs the function of I3 and N4 in FIG. 1.

When P1 is first turned on with the output at ground, P54 has zero volts applied to its gate and $V_{DD}$ volts at its source-node 2.

However, under normal operation P1 quickly charges the output to, or close to, $V_{DD}$ volts and P54 is turned off before node is discharged from $V_{DD}$ to $[V_{DD}-V_T]$ volts.

If the potential at output 22 remains at or close to zero volts for longer than $T_{D4}$, where $T_{D4}$ is the time it takes P54 to discharge node 2 below $V_{DD}-V_T$, then P2 turns on raising the potential of node 1 and decreasing the conductivity of P1. The rise in V1 raises the drain potential of P54 which decreases the conduction through its conduction path. This circuit thus, illustrates the operation of a protection circuit with a single negative feedback stage.

What is claimed is:

1. The combination comprising:
   a transistor having first and second electrodes defining the ends of its conduction path and a control electrode;
   a power terminal adapted to receive an operating potential;
   an output terminal;
   negligible impedance means connecting the conduction path of said transistor between said power and output terminals;
   means independent of the voltages at said power and output terminals for selectively applying a turn on signal to the control electrode of said transistor for causing a flow of current between said power and output terminals through the conduction path of said transistor and for driving said output terminal toward the operating potential at said power terminal; and
   means coupled to the control electrode of said transistor responsive to the application of said turn on signal and to the potential at said output terminal for substantially decreasing current conduction to a value greater than zero through said transistor only after a given time period if the voltage at said output terminal does not reach a predetermined value within said given time period.

2. The combination as claimed in claim 1 wherein said means coupled to the control electrode of said transistor responsive to the application of said turn on signal and to the potential at said output terminal for substantially decreasing current conduction through said transistor if the potential at said output terminal does not reach a predetermined value within a given time period after the turn on of said transistor, includes a delay network for decreasing current in said transistor a time $T_D$ after it is turned on; where $T_D$ is less than a time $T_{TH}$, where $T_{TH}$ defines the point in time at which said transistor may be damaged if high level conduction persists through the transistor; and negative feedback means for controlling and limiting the decrease in the conductivity of said transistor to a value greater than zero.

3. The combination as claimed in claim 1 wherein said output terminal is adapted to drive a given load;

wherein the time for said transistor to charge said output terminal to said predetermined value when said given load is connected thereto is $T_N$;

wherein said transistor has a thermal time constant which defines the point at which said transistor may be damaged if high level conduction through said transistor persists for a period of time $T_{TH}$;

wherein said given time period is a time $T_D$, where $T_D$ is greater than $T_N$ and less than $T_{TH}$; and wherein said means coupled to the control electrode of said transistor includes a delay network for decreasing conduction through said transistor a time $T_D$ after said transistor is turned on if said output terminal does not reach said predetermined value.

4. The combination as claimed in claim 1 wherein said transistor is an output transistor; and wherein said means coupled to the control electrode of said transistor responsive to the application of said turn on signal and to the potential at said output terminal includes: (a) a second transistor having first and second electrodes defining the ends of a conduction path and a control electrode; (b) means connecting the conduction path of said second transistor between said power terminal and the control electrode of said output transistor; and (c) means for applying a turn on signal to the control electrode of said second transistor within said given time period after the turn on of said output transistor if the potential at said output terminal does not reach said predetermined value;

said second transistor when turned on producing a signal at the control electrode of said output transistor having a polarity and magnitude to decrease the conductivity of said output transistor.

5. The combination as claimed in claim 4 wherein said means for applying a turn on signal to the control electrode of said second transistor includes: (a) a third transistor having its conduction path connected between the control electrode of said second transistor and said power terminal; said third transistor being biased to function as a resistive element; (b) a fourth transistor having its conduction path connected between the control electrode of said second transistor and said output terminal; and (c) means for applying a turn on signal to the control electrode of said fourth transistor when said output transistor is turned on.

6. The combination as claimed in claim 4 wherein said means for applying a turn on signal to the control electrode of said second transistor includes: (a) a third transistor having its conduction path connected between the control electrode of said second transistor and said power terminal; said third transistor being biased to function as a resistive element; (b) a fourth transistor having its conduction path connected between the control electrode of said second transistor and the control electrode of said output transistor; and (c) means for coupling the signal at said output terminal to the control electrode of said fourth transistor.

7. The combination as claimed in claim 1 wherein said transistor is an output transistor; and wherein said means responsive to the application of said turn on signal and to the potential at said output terminal includes: (a) a second transistor having first and second electrodes defining the ends of a conduction path and a control electrode; (b) means applying a signal indicative of the turn on of said output transistor to the control electrode of said second transistor; and (c) means connecting one of the first and second electrodes of said second transistors to said output terminal for causing said second transistor to conduct in the voltage follower mode.

8. The combination as claimed in claim 7 wherein said means responsive to the application of said turn on signal and to the potential at said output terminal also includes a delay network connected to the other one of the first and second electrodes of said second transistor, said delay network for producing a given output a time $T_D$ after said second transistor is turned on.

9. The combination as claimed in claim 8 wherein said means responsive to the application of said turn on signal and to the potential at said output terminal also includes a third transistor connected at its control electrode to said delay network and responsive to said given output for applying a potential to the control electrode of said output transistor having a polarity and magnitude to decrease conduction through said output transistor.

10. The combination as claimed in claim 9 wherein said output transistor is of one conductivity type and said second transistor is of different conductivity type.

11. The combination as claimed in claim 10 wherein said first, second and third transistors are insulated-gate field effect transistors, wherein said first and third transistors are connected at their source electrodes to said power terminal;

wherein said third transistor is connected at its drain to the gate of said first transistor, and wherein said second transistor is connected at its source to said output terminal and at its drain to the gate of said third transistor.

12. The combination as claimed in claim 11 wherein said delay network includes: (a) the conduction path of a fourth transistor having its conduction path connected between the drain of said second transistor and said power terminal; and (b) the capacitance present between the drain of said second transistor and said power terminal.

13. The combination as claimed in claim 1 wherein said transistor is a first output transistor;

wherein said means for selectively applying a turn on signal to the control electrode of said first transistor includes a first inverter;

wherein said means responsive to the application of said turn on signal and to the potential at said output terminal includes, second, third and fourth inverting means; each inverting means having an input and an output;

wherein said second inverting means is connected at its input to the output of said first inverting means and at its output to the input of said third inverting means;

wherein said third inverting means includes a transistor having its control electrode connected to the input of said third inverting means, one end of its conduction path connected to said output terminal, and the other end of its conduction path connected to the output of said third inverting means; and means connecting the input of said fourth inverting means to the output of said third inverting means and the output of said fourth inverting means to the input of said second inverter means.

14. The combination as claimed in claim 1 wherein said power terminal is a first power terminal and further including a second power terminal;

said first and second power terminals adapted to receive an operating potential;

wherein said transistor is a first transistor; and further including a second transistor having its conduction path connected between said second power terminal and said output terminal;

means for selectively applying a turn on signal to the control electrode of said second transistor for passing a current between said second power terminal and said output terminal and for clamping said output terminal to the potential at said second power terminal; and means coupled to the control electrode of said second transistor responsive to the application of a turn on signal to it and to the potential at said output terminal for substantially decreasing current conduction through said second transistor if the potential at said output terminal does not reach a predetermined value within a given time period after the turn on of said second transistor.

* * * * *

UNITED STATES PATENT AND TRADEMARK OFFICE
CERTIFICATE OF CORRECTION

PATENT NO. : 4,329,600
DATED : May 11, 1982
INVENTOR(S) : Roger Green Stewart

It is certified that error appears in the above-identified patent and that said Letters Patent is hereby corrected as shown below:

Col. 2, line 67 "23" should be --- 24 ---.

Col. 5, line 21 insert after "still" --- to ---.

Col. 6, line 55 delete the word "data" and insert

---- output ---.

Signed and Sealed this

Fourteenth Day of December 1982

[SEAL]

Attest:

Attesting Officer

GERALD J. MOSSINGHOFF
Commissioner of Patents and Trademarks